United States Patent [19]

Park

[11] Patent Number: 5,623,201

[45] Date of Patent: Apr. 22, 1997

[54] 3-PHASE POWER METER HAVING A DISPLAY BOARD

[75] Inventor: Hyo-Jeong Park, Seoul, Rep. of Korea

[73] Assignee: Samsung Electronics Co., Ltd., Suwon, Rep. of Korea

[21] Appl. No.: 593,630

[22] Filed: Jan. 30, 1996

Related U.S. Application Data

[63] Continuation-in-part of Ser. No. 274,823, Jul. 14, 1994, abandoned.

[30] Foreign Application Priority Data

Sep. 28, 1993 [KR] Rep. of Korea .................. 93-20244

[51] Int. Cl.⁶ ........................................ G01R 19/00
[52] U.S. Cl. ......................................... 324/107
[58] Field of Search ............... 73/866.3; 340/461, 340/462, 815.45, 815.55; 364/483; 324/96, 122, 107, 114

[56] References Cited

U.S. PATENT DOCUMENTS

| | | | |
|---|---|---|---|
| 4,333,050 | 6/1982 | Yeasting | 324/107 |
| 4,641,090 | 2/1987 | Danby | 324/107 |
| 4,753,117 | 6/1988 | Osterhout et al. | |
| 4,890,088 | 12/1989 | Woodell | 340/461 |
| 4,908,868 | 3/1990 | McTaggart. | |

*Primary Examiner*—Robert Raevis
*Attorney, Agent, or Firm*—Cushman Darby & Cushman IP Group of Pillsbury Madison & Sutro LLP

[57] ABSTRACT

A 3-phase power meter for measuring and displaying a set of physical quantities of R-, S- and T-phase electric power generated by a 3-phase AC alternator includes a display unit for displaying the set of the measured physical quantities of the R-, S- and T-phase electric power, the display unit having three display arrays integrally formed therein, each of the display arrays having a plurality of thin and elongated display elements closely stacked in a column to produce a bar-type graph, each of the display arrays serving to indicate the level of each of the measured physical quantities of the R-, S- and T-phase electric power in a discrete manner, respectively and a screen attached on the surface of the display unit and having an opening through which the levels of the R- S- and T-phase electric power indicated by the display arrays are made visible all together, wherein the opening has an outline to form a shape of a symbol used to identify of a measured physical quantity of the electric power.

2 Claims, 5 Drawing Sheets

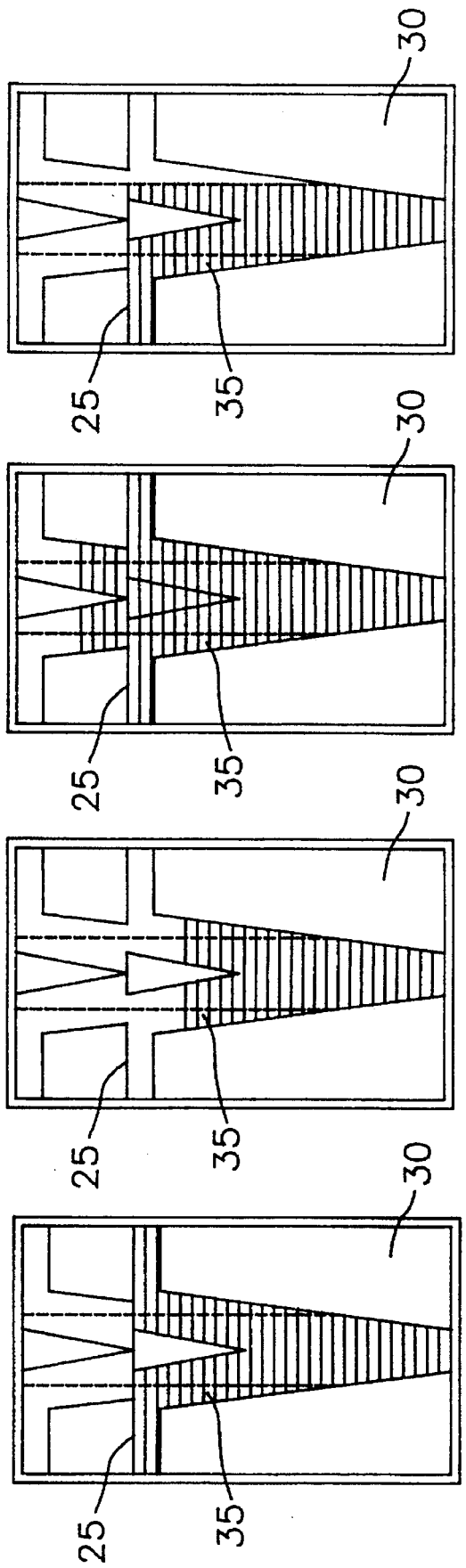

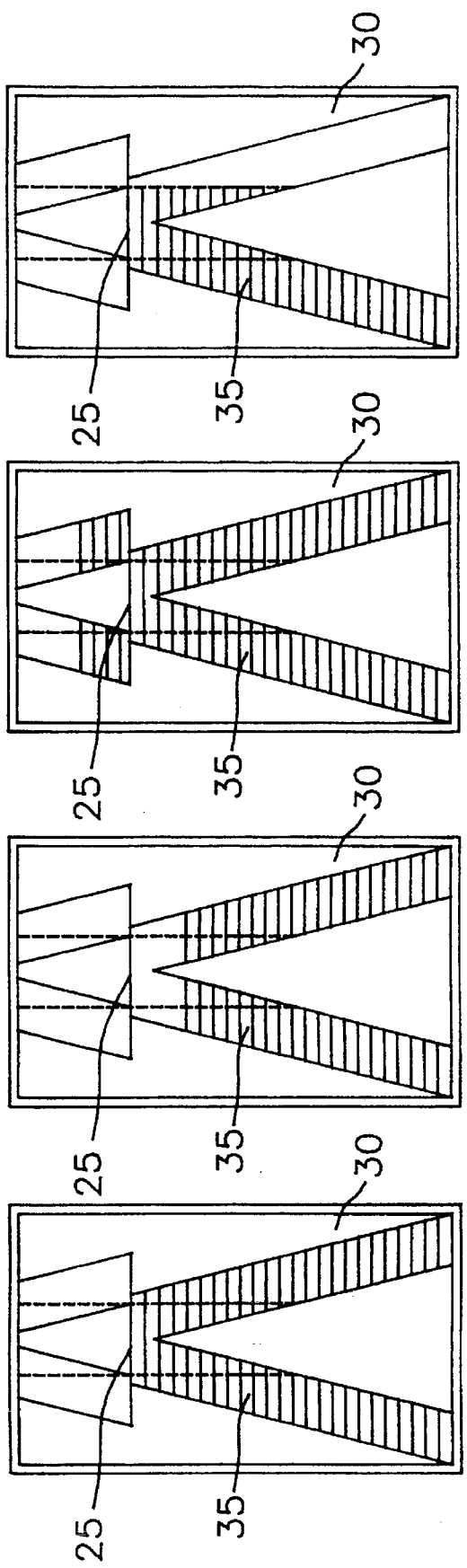

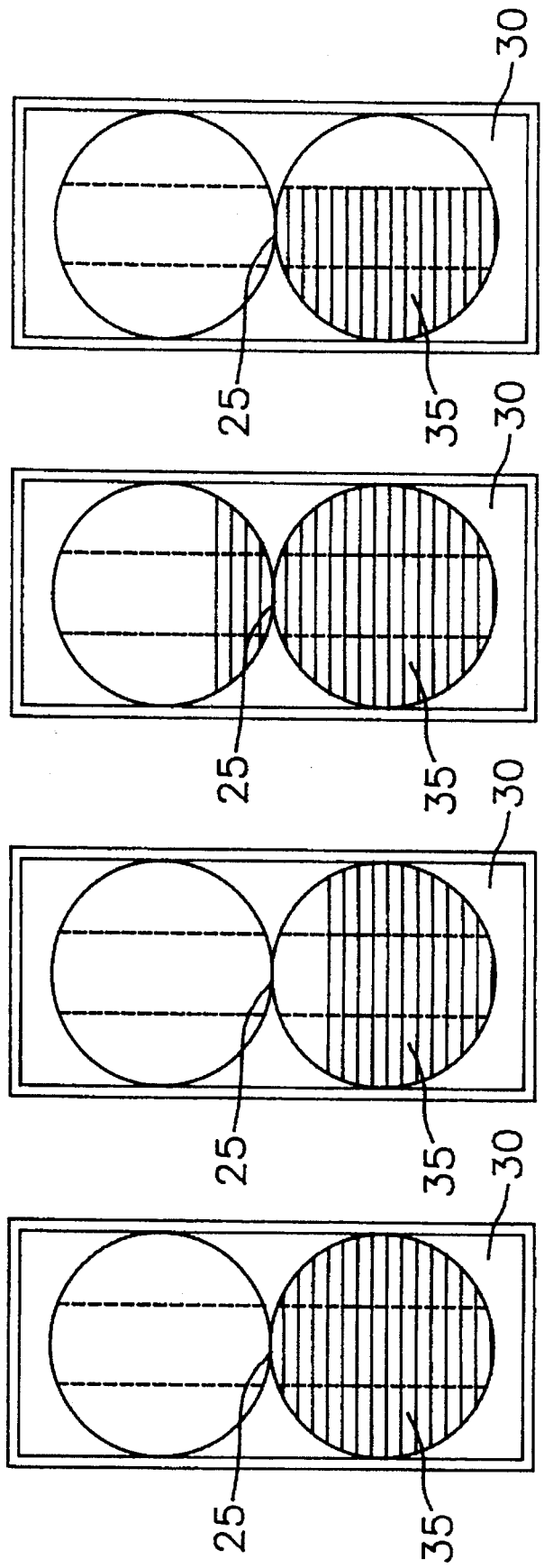

3-PHASE POWER METER HAVING A DISPLAY BOARD

CROSS-REFERENCE TO THE RELATED APPLICATION

This application is a continuation-in-part of U.S. Ser. No. 08/274,823 filed on Jul. 14, 1994, now abandoned.

FIELD OF THE INVENTION

The present invention relates to a 3-phase power meter for measuring physical quantities of R-, S- and T-phase electric power generated by a 3-phase power system; and, more particularly, to a 3-phase power meter having a display board capable of simultaneously indicating thereon a set of physical quantities, e.g., voltage, current and frequency, of R-, S- and T-phase electric power measured by the 3-phase power meter.

DESCRIPTION OF THE PRIOR ART

In a power generation, transmission and transformation system, it is often necessary to monitor and supervise the operation status of a survey object, e.g., a 3-phase AC alternator for generating 3-phase (R-, S- and T-phases) electric power. A 3-phase power meter, which may be one of the types of a dial meter and a bar meter, is employed to measure physical quantities, i.e., voltage, current and frequency, of the 3-phase electric power generated by the 3-phase AC alternator and record the measured physical quantities of the 3-phase electric power. Typically, the dial type and the bar type 3-phase power meters display a numerical value and an indicated bar level corresponding to one of the physical quantities of R-, S- and T-phase electric power on their respective gauge boards. However, since the numerical value or the indicated bar level shown on a gauge board is merely a piece of comparative information with respect to a reference value or level, it may be difficult to make a direct decision from the information as to how far the numerical value or the bar level deviates from a normal operating range of the survey object.

Further, since a prior art 3-phase power meter incorporates therein a phase selection switch to individually select a desired phase for measuring only one physical quantity, the display system of the prior art 3-phase power meter has the built-in limitation to indicate only a single physical quantity of the phase chosen by the phase selection switch.

SUMMARY OF THE INVENTION

It is, therefore, an object of the present invention to provide an improved 3-phase power meter having a display board capable of readily monitoring and identifying the operating status of a 3-phase AC alternator by measuring and recording physical quantities of R-, S- and T-phase electric power generated by the 3-phase AC alternator.

It is another object of the present invention to provide a 3-phase power meter having a display board capable of showing thereon a set of measured physical quantities of R-, S- and T-phase electric power generated by a 3-phase AC alternator, simultaneously.

In accordance with the present invention, there is provided a 3-phase power meter for simultaneously measuring and displaying a set of physical quantities of R-, S- and T-phase electric power generated by a 3-phase AC alternator, which comprises:

a display unit for displaying the set of measured physical quantities of R-, S- and T-phase electric power, the display unit having three display arrays integrally formed therein, each of the display arrays having a plurality of thin and elongated display elements closely stacked in a column to produce a bar-type graph, each of the display arrays serving to indicate each one of the levels of the measured physical quantities of the R-, S- and T-phase electric power in a discrete manner, respectively;

a screen attached on the surface of the display unit and having an opening through which the individual levels of the measured physical quantities indicated by the display arrays are made visible all together;

a transformer module having a set of three transformers, each of the three transformers detecting an AC voltage of each one of the R-, S- and T-phase electric power, respectively;

an effective value conversion module having a set of three root mean square converters, each of the converters converting the AC voltage of each of the R-, S- and T-phase electric power to a DC voltage level, respectively;

a current driving circuit module having a set of three current drivers, each of the current drivers, in response to each of the DC voltage levels converted by its corresponding converter, producing an electrical current value corresponding to each of the DC voltage levels, respectively; and a display driving circuit having a set of three display drivers, each of the display drivers driving the display elements within each of the display arrays in a step by step manner in accordance with the electrical current value from each of the current drivers, respectively.

BRIEF DESCRIPTION OF THE DRAWINGS

The above and other objects and features of the present invention will become apparent from the following description of preferred embodiments, when taken in conjunction with the accompanying drawings, in which:

FIGS. 3A to 5D illustrate graphic patterns formed on the display board with respect to voltage, current and frequency as the measured physical quantities, respectively.

DETAILED DESCRIPTION OF THE PREFERRED EMBODIMENTS

Figure 1:
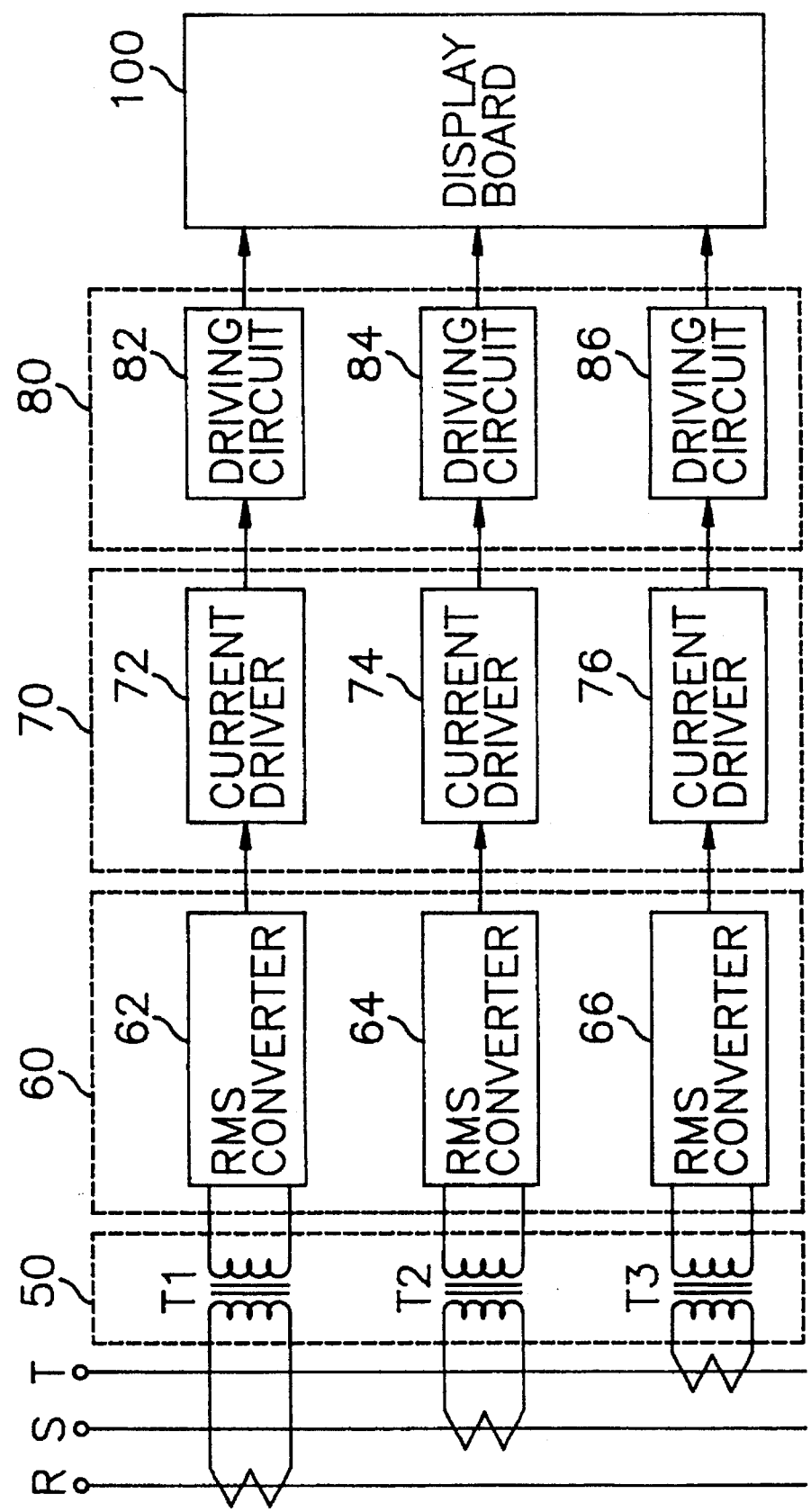
FIG. 1 shows a block diagram of a 3-phase power meter having a display board in accordance with the present invention.

Referring to FIG. 1, a 3-phase power meter is shown with a display board 100 which is capable of indicating the operating status of a 3-phase AC alternator (not shown) to an observer in accordance with the present invention. The 3-phase power meter measures physical quantities, i.e., voltage, current and frequency, of R-, S- and T-phase electric power generated by a 3-phase AC alternator and indicates the levels of the measured physical quantities of the 3-phase electric power on the display board 100.

For the sake of illustration, it is assumed that the 3-phase AC alternator utilized in the present invention is a power system of a type which has a load with a constant electric power consumption.

Figure 2:
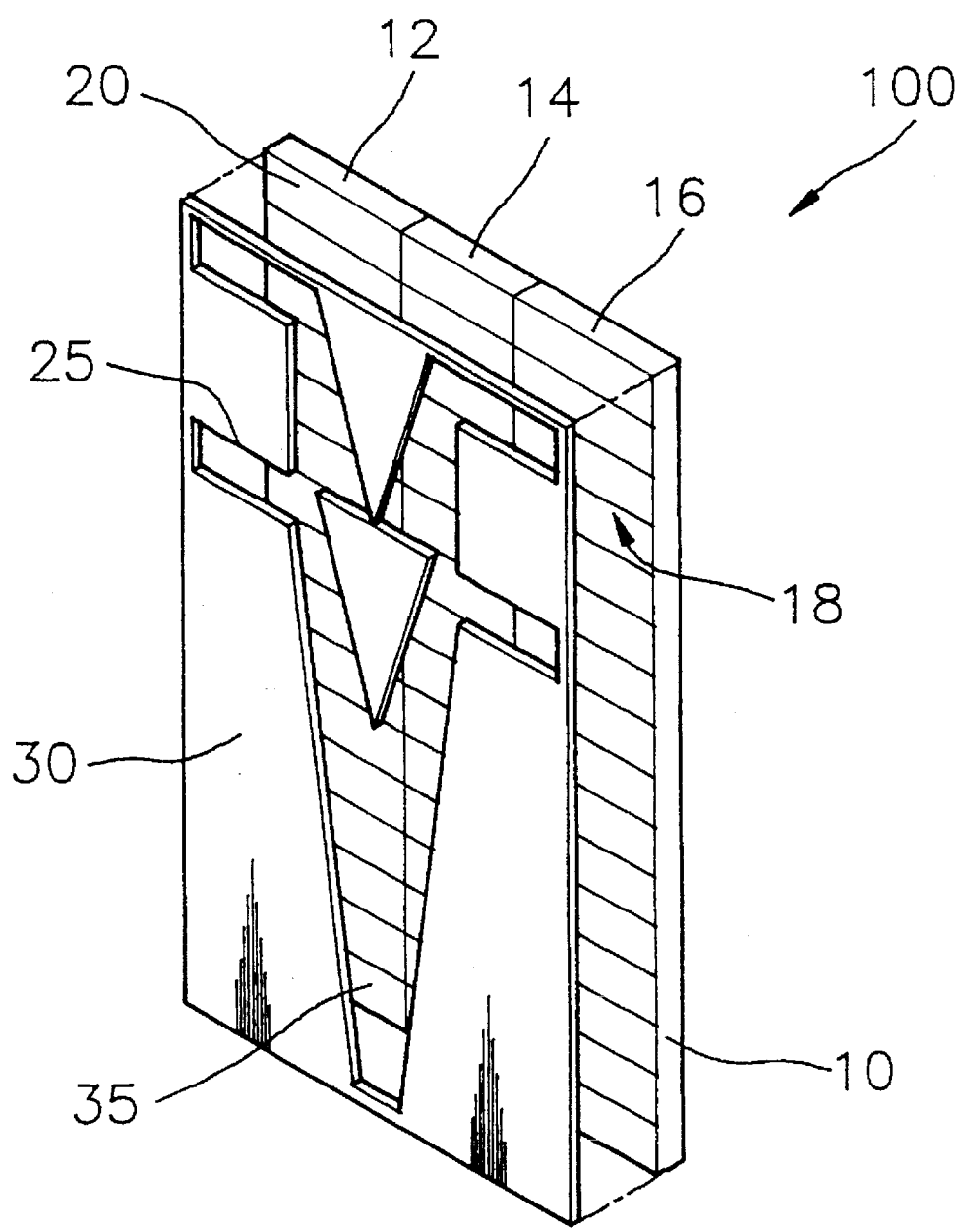
FIG. 2 represents a perspective view of the display board shown in FIG. 1.

As best shown in FIG. 2, the display board 100 comprises a display unit 10 and a screen attached on a surface 18 of the display unit 10. The display unit 10 comprises a set of three display arrays 12, 14, and 16 integrally formed therein, each of the display arrays serves to indicate each level of the measured physical quantities of R-, S- and T-phases and has a plurality of display elements 20 arranged in a column. For instance, the display arrays 12, 14 and 16 includes 30, 50, or 100 such display elements 20, respectively.

Each of the display elements 20 within each of the display arrays 12, 14 and 16 is made in the form of a thin and elongated optical member in order to improve its visibility and is closely stacked in each column of the display arrays 12, 14 and 16 to produce a bar-type graph to indicate a level in a step-by-step manner. The display elements 20 are preferably integrally manufactured in order to make the surface 18 flat and smooth for an easy attachment of the screen 30 on the surface 18.

In accordance with a preferred embodiment of the invention, each of the display elements is preferably of a width ranging from 0.3 to 2 mm and of a length ranging from 3 to 12 mm; and may be made of, e.g., a light emitting diode ("LED") or a liquid crystal display ("LCD").

The screen 30 attached to the flat surface 18 has a window or opening 35 through which the levels indicated by the display arrays 12, 14 and 16 in the display unit 10 are made visible all together. The screen 30 comprises a sheet tape preferably colored to identify and differentiate the items to be measured.

The opening 35 has an outline to form a shape of a symbol corresponding to the physical quantity to be displayed through the opening. For example, FIGS. 3, 4 and 5 illustrate exemplary shapes of the opening 35, wherein the levels indicated by the display unit 10 are made visible through the opening 35 by light behind it. Each of the shapes illustrated in FIGS. 3A to 3D has a V-shame symbolizing an electric voltage as the measured physical quantity and each of the shapes illustrated in FIGS. 4A to 4D has an A-shape symbolizing an electric current as the measured physical quantity. Similarly, FIGS. 5A to 5D illustrate shapes representative of the frequency as the measured physical quantity. Furthermore, each of the openings has a guide line 25 indicating a boundary between a normal and an abnormal states of the measured physical quantity, which will be discussed hereinafter.

Referring back to FIG. 1, three transformers T1, T2 and T3 in a transformer module 50 detect voltage levels of the R-, S- and T-phase electric power of a 3-phase AC alternator from their primary windings coupled to R-, S- and T-lines (R, S and T), respectively.

Each of the three RMS (root mean square) converters 62, 64 and 66 in the effective value conversion module 60 receives each one of the detected voltages through each one of secondary windings of the transformers T1, T2 and T3, respectively, and converts said each detected voltage to a DC voltage level ranging from 0 to 5 volts which is then applied to a current driving circuit module 70.

Thereafter, each of the current drivers 72, 74 and 76 in the current driving circuit module 70 produces a current value ranging from 4 to 20 mA corresponding to the DC voltage level from the effective value conversion module 60.

Each of the display driving circuits 82, 84 and 86 in the display driver module 80 drives the display elements 20 within each of the display arrays 12, 14 and 16 in the display unit 10 in accordance with the current value from the current driving module 70.

As a result, the levels indicated in the display unit 10 are made graphically visible through the opening 35 as the display elements 20 are controlled by the display driving circuits to light them in a discrete manner.

FIGS. 3A to 3D illustrate cases, wherein the opening 35 outlines a V-shape, symbolizing that the physical quantities measured are voltage levels for the R-, S- and T-phases. More specifically, FIG. 3A indicates that all the measured voltage levels for the three phases reaches up to the guideline 25, indicating a normal state; FIGS. 3B and 3C represent cases where all of the measured voltage levels of the three phases simultaneously deviate from the guideline 25, too low and too high, respectively. On the other hand, FIG. 3D illustrates a case where the measured voltage levels of the R- and S-phases remain at normal values, but there is no voltage level measured for T-phase due to, e.g., a failure in the T-phase voltage generation of the 3-phase AC alternator.

In case where the physical quantities measured are electrical currents for the three phases, the opening 35 having an A-shaped symbol indicating that the measured physical quantities are the current levels as shown in FIGS. 4A to 4D. FIG. 4A illustrates a situation where all the measured current levels remain at their normal values; FIGS. 4B and 4C show cases where the measured current levels are all too low and too high, respectively; and FIG. 4D describes an incident where each of the measured current levels of the R- and S-phases remains at a normal state, but there is no current detected for the T-phase due to, e.g., failure in the T-phase current generation of the 3-phase alternator.

In a situation that the physical quantities measured are frequencies for the three phases, the opening 35 has an 8-shaped outline as shown in FIGS. 5A to 5D. FIG. 5A illustrates a situation where all the measured frequency levels remain at their normal values; FIGS. 5B and 5C show cases where the measured current levels are too low and too high, respectively; and FIG. 5D describes an incident where each of the measured current levels of the R- and S-phases remains at a normal state, but there is no frequency detected for the T-phase due to, e.g., failure in the T-phase frequency generation of the 3-phase alternator.

In accordance with the present invention, therefore, it is possible to promptly monitor and identify the operating state of a survey object, e.g., 3-phase power system such as 3-phase AC alternator, and then to take an immediate step to attend to the occasion, when necessary.

Although the present invention has been shown and described with respect to the particular embodiments only, it will be apparent to those skilled in the art that many changes and modifications may be made without departing from the spirit and scope of the present invention as defined in the appended claims.

What is claimed is:

1. A 3-phase power meter for simultaneously measuring and displaying a set of physical quantities of R-, S- and T-phase electric power generated by a 3-phase AC alternator, which comprises:

a display unit for displaying the set of measured physical quantities of R-, S- and T-phase electric power, the display unit having three display arrays integrally formed therein, each of the display arrays having a plurality of thin and elongated display elements closely stacked in a column to produce a bar-type graph, each of the display arrays serving to indicate each one of the levels of the measured physical quantities of the R-, S- and T-phase electric power in a discrete manner, respectively;

a screen attached on the surface of the display unit and having an opening through which the individual levels of the measured physical quantities indicated by the display arrays are made visible all together wherein the opening has a guideline indicating a boundary between a normal state and an abnormal state of the individual levels;

a transformer module having a set of three transformers, each of the three transformers detecting an AC voltage of each one of the R-, S- and T-phase electric power, respectively;

an effective value conversion module having a set of three root mean square converters, each of the converters converting the AC voltage of each of the R-, S- and T-phase electric power to a DC voltage level, respectively;

a current driving circuit module having a set of three current drivers, each of the current drivers, in respond to each of the DC voltage levels converted by its corresponding converter, producing an electrical current value corresponding to each of the DC voltage levels, respectively; and a display driving circuit having a set of three display drivers, each of the display drivers driving the display elements within each of the display arrays in a step-by-step manner in accordance with the electrical current value from each of the current drivers, respectively.

2. The 3-phase meter of claim 1, wherein the opening has an outline to form a character shape of a symbol used to identify one of the measured physical quantities.

* * * * *